(12) United States Patent
Wong et al.

(10) Patent No.: US 7,321,951 B2
(45) Date of Patent: Jan. 22, 2008

(54) METHOD FOR TESTING FLASH MEMORY POWER LOSS RECOVERY

(75) Inventors: Wanmo Wong, Menlo Park, CA (US); Karunakaran Muthusamy, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 377 days.

(21) Appl. No.: 10/714,780

(22) Filed: Nov. 17, 2003

(65) Prior Publication Data

US 2005/0108491 A1 May 19, 2005

(51) Int. Cl.
*G06F 12/00* (2006.01)

(52) U.S. Cl. ..................... 711/103; 711/167
(58) Field of Classification Search ............... None
See application file for complete search history.

(56) References Cited

U.S. PATENT DOCUMENTS

| | | | |
|---|---|---|---|
| 5,245,577 A | 9/1993 | Duesman | |
| 5,539,699 A * | 7/1996 | Sato et al. | 365/201 |
| 5,675,540 A | 10/1997 | Roohparvar | |
| 5,896,398 A * | 4/1999 | Sekine | 714/720 |
| 6,003,149 A | 12/1999 | Nevill | |
| 6,105,152 A | 8/2000 | Duesman | |
| 6,178,532 B1 | 1/2001 | Pierce | |
| 6,182,188 B1 * | 1/2001 | Hasbun et al. | 711/103 |
| 6,275,960 B1 * | 8/2001 | Cappelletti et al. | 714/718 |
| 6,324,088 B1 | 11/2001 | Keeth | |
| 6,357,025 B1 | 3/2002 | Tuttle | |
| 6,418,070 B1 | 7/2002 | Harrington | |
| 6,536,004 B2 | 3/2003 | Pierce | |
| 6,618,304 B2 | 9/2003 | Duesman | |
| 6,630,685 B1 | 10/2003 | Lunde | |
| 6,971,048 B1 * | 11/2005 | Hanson et al. | 714/41 |
| 2002/0054528 A1 * | 5/2002 | Tabata et al. | 365/218 |
| 2002/0133765 A1 * | 9/2002 | Antosh et al. | 714/718 |
| 2002/0157053 A1 * | 10/2002 | Chen et al. | 714/744 |
| 2002/0178414 A1 | 11/2002 | Roohparvar | |
| 2003/0023840 A1 | 1/2003 | Zitlaw | |
| 2003/0041210 A1 | 2/2003 | Keays | |
| 2003/0075609 A1 * | 4/2003 | Kim | 235/492 |
| 2003/0090285 A1 * | 5/2003 | Sher et al. | 324/763 |
| 2003/0107918 A1 * | 6/2003 | Koyama et al. | 365/185.09 |

OTHER PUBLICATIONS

Microsoft Computer Dictionary, 5th edition © 2002 Microsoft Press, p. 155.*

* cited by examiner

*Primary Examiner*—Donald Sparks
*Assistant Examiner*—Horace L. Flournoy
(74) *Attorney, Agent, or Firm*—Leffert Jay & Polglaze, P.A.

(57) ABSTRACT

Non-volatile memory device, driver, and method is described that utilizes write or erase cycle tracking to interrupt or stop a non-volatile memory programming or erase operation at a selected point to interrupt/stop execution or simulate power loss at a specific point. This ability allows for a deterministic and repeatable testing process of all write or erase cycles of a non-volatile command where the state of floating gate memory cells are changed in the non-volatile memory device. Additionally, this ability to utilize write or erase cycle tracking to interrupt or stop a non-volatile memory programming operation or erasing operation at any selected point enables simulation of power loss at each point in a selected operation that a non-volatile floating gate memory cell is programmed or erased, allowing for improved, deterministic testing of the power loss recovery cycle and faster code/design change verification.

39 Claims, 4 Drawing Sheets

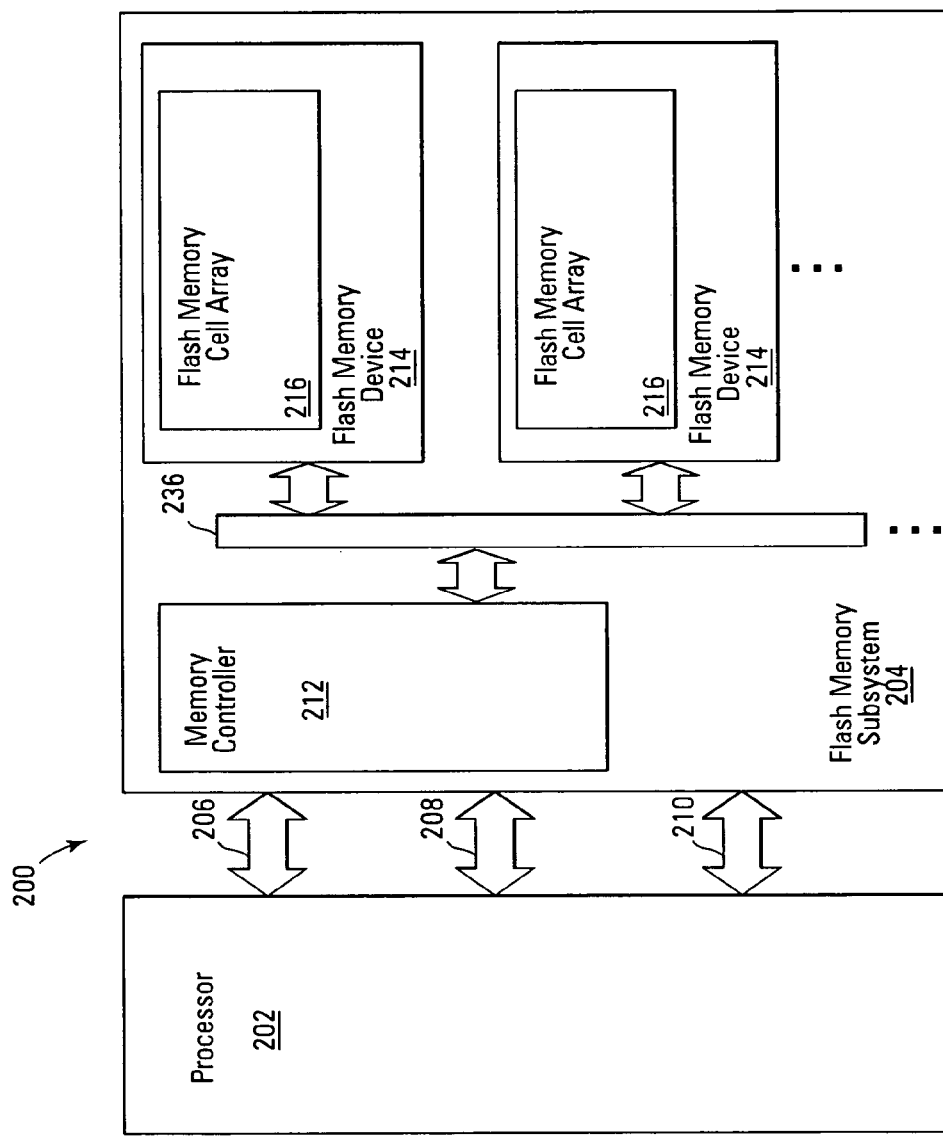

METHOD FOR TESTING FLASH MEMORY POWER LOSS RECOVERY

TECHNICAL FIELD OF THE INVENTION

The present invention relates generally to non-volatile memory devices and in particular the present invention relates to Flash memory device management software, drivers, and power loss recovery testing.

BACKGROUND OF THE INVENTION

Memory devices are typically provided as internal storage areas in a computer. The term memory identifies data storage that comes in the form of integrated circuit chips. There are several different types of memory used in modern electronics, one common type is RAM (random-access memory). RAM is characteristically found in use as main memory in a computer environment. RAM refers to read and write memory; that is, you can both write data into RAM and read data from RAM. This is in contrast to ROM (read-only memory), which permits you only to read data. Most RAM is volatile, which means that it requires a steady flow of electricity to maintain its contents. As soon as the power is turned off, whatever data was in RAM is lost.

Computers almost always contain a small amount of ROM that holds instructions for starting up the computer, typically called a basic input output system (BIOS). Unlike RAM, ROM generally cannot be written to by a user. An EEPROM (electrically erasable programmable read-only memory) is a special type non-volatile ROM that can be erased by exposing it to an electrical charge. EEPROM comprise a large number of memory cells having electrically isolated gates (floating gates). Data is stored in the memory cells in the form of charge on the floating gates. Charge is transported to or removed from the floating gates by specialized programming and erase operations, respectively.

Yet another type of non-volatile memory is a Flash memory. A Flash memory is a type of EEPROM that can be erased in blocks instead of one byte at a time. A typical Flash memory comprises a memory array, which includes a large number of memory cells. The memory cells of a Flash memory array are typically arranged into a "NOR" architecture (where each cell directly coupled to a bitline) or a "NAND" architecture (where the cells are coupled into "strings" of cells, such that each cell is coupled indirectly to a bitline and requires activation of the other cells of the string for access to a selected cell). Each of the memory cells includes a floating gate field-effect transistor capable of holding a charge. The data in a cell is determined by the presence or absence of the charge in the floating gate. The cells are usually grouped into sections called "erase blocks." Each of the cells within an erase block can be electrically programmed in a random basis by charging the floating gate. The charge can be removed from the floating gate by a block erase operation, wherein all floating gate memory cells in the erase block are erased in a single operation. Other types of non-volatile memory include, but are not limited to, Polymer Memory, Ferroelectric Random Access Memory (FeRAM), Ovionics Unified Memory (OUM), and Magnetoresistive Random Access Memory (MRAM).

Many Flash memory devices are utilized with specialized software handling and/or management routines, generally referred to as "drivers." The Flash memory drivers are executed on the "host," typically a processor or memory controller, and allow the Flash memory device(s) being utilized to be read from and written to by the host. The drivers also provide a layer of logical abstraction for the host; presenting the Flash memory device as a freely re-writeable general access memory device or mass storage device, such as a hard drive, a floppy disk, or other non-volatile machine-usable storage device. The drivers, as part of the Flash memory device software interface/hardware abstraction, typically also manage the internal operation of the Flash memory device; scheduling erase blocks to be erased, managing bad erase blocks, protecting and unprotecting erase blocks, power loss recovery, and load leveling (also called wear leveling) the Flash memory device.

The driver and/or memory management routines are generally supplied by the Flash memory manufacturer to the end-user or system manufacturer. These driver routines are typically supplied in a source code format or as a linkable library and as such must be compiled into the operating system or overall code executing on the device. Self contained and separately loadable drivers also exist, but are typically not utilized in embedded processor devices.

A problem with utilizing Flash memory devices, particularly in embedded processor or portable battery powered systems, is dealing with potentially intermittent power sources or power availability. As Flash memory is non-volatile, once data is stored it will not be affected by loss of power. However, as data write operations, block erasures, and other internal Flash management operations that store or change data or the operating state of the Flash memory device are generally not single step operations, the Flash memory can be left in an incomplete state by a power loss event. For example, a make directory command requires 43 separate write/erase operations by the driver of a specific Flash memory device to complete. Because of these issues the driver software contains "power loss recovery" routines that sequence the Flash memory device through a power loss recovery cycle to check for such uncompleted operations upon power up, and, if possible, finish or correct them.

The testing of these power loss recovery cycles and drivers routines (herein referred to as the power loss recovery cycle) in prior art Flash memory devices and systems has generally involved randomized power loss testing. In this form of system testing, power is removed from the system at a random point during a selected write, erase, or Flash memory management operation and then is restored, testing the power loss recovery cycle and associated driver routines. The testing of a selected write, erase, or Flash memory management operation is continued in this manner for an indefinite period of time (as much as 2 to 3 days), until an appropriate level of confidence in the power loss recovery cycle is achieved. This approach is problematic in that it is empirically based and cannot completely guarantee even after a large number of testing cycles that an error is not present in the power loss recovery cycle or routines; the true coverage of the test is unknown. This form of testing is also time consuming and requires exhaustive testing or retesting when a section of code or hardware is written or changed to verify its correct operation.

For the reasons stated above, and for other reasons stated below which will become apparent to those skilled in the art upon reading and understanding the present specification, there is a need in the art for alternative apparatus and methods of testing Flash memory devices, their driver programs, and power loss recovery cycles.

SUMMARY

The above-mentioned problems with testing Flash memories, Flash memory drivers, power loss recovery testing, and other problems are addressed by the present invention and will be understood by reading and studying the following specification.

The various embodiments of the present invention relate to deterministic testing and verification of non-volatile memories, non-volatile memory drivers, write operations/cycles, block erase operations/cycles, non-volatile memory management operations, and power loss recovery testing. The memory device and software embodiments of the present invention utilize write or erase cycle tracking to interrupt or stop a non-volatile memory programming operation at a selected point. This ability to utilize write or erase cycle tracking to interrupt or stop a non-volatile memory programming operation at a selected point allows for halting or interrupting execution at each point in a selected operation that a non-volatile memory cell is programmed or erased. This allows for a deterministic and repeatable testing process of all stages of a write cycle or erase cycle where the state of non-volatile memory cells are changed in the non-volatile memory device. This also allows for step-through testing of each stage by programmer/designer of state changes non-volatile memory cells in the non-volatile memory device or driver software, enabling quick testing and easy logic and code changes, saving time and resources. Additionally, this ability to utilize write or erase cycle tracking to interrupt or stop a non-volatile memory programming operation at a selected point enables simulation of power loss at each point in a selected operation that a non-volatile memory cell is programmed or erased, allowing for improved, deterministic testing of the power loss recovery cycle and faster code/design change verification.

For one embodiment, the invention provides a method of operating a non-volatile memory device driver comprising counting a number of access cycles to a non-volatile memory, and halting execution at a selected count.

For another embodiment, the invention provides a method of operating a system comprising counting a number of access operations to a Flash memory device coupled to a host, and stopping execution at a selected number of access operations.

For yet another embodiment, the invention provides a method of testing a Flash memory comprising counting a number of access operations to a Flash memory for a Flash command, interrupting execution of the Flash command at a selected halt count of access operations, and executing a power loss recovery cycle to test power loss recovery at the selected halt count.

For a further embodiment, the invention provides a system comprising at least one Flash memory device, and a host coupled to the at least one Flash memory device, wherein the host is adapted to count a number of access operations to the at least one Flash memory device during a Flash command and halt execution of the Flash command at a selected count of access operations.

Further embodiments of the invention include methods and apparatus of varying scope.

BRIEF DESCRIPTION OF THE DRAWINGS

FIG. 2 is a simplified block diagram of a system containing a Flash memory subsystem in accordance with an embodiment of the present invention.

DETAILED DESCRIPTION

Figure 1:
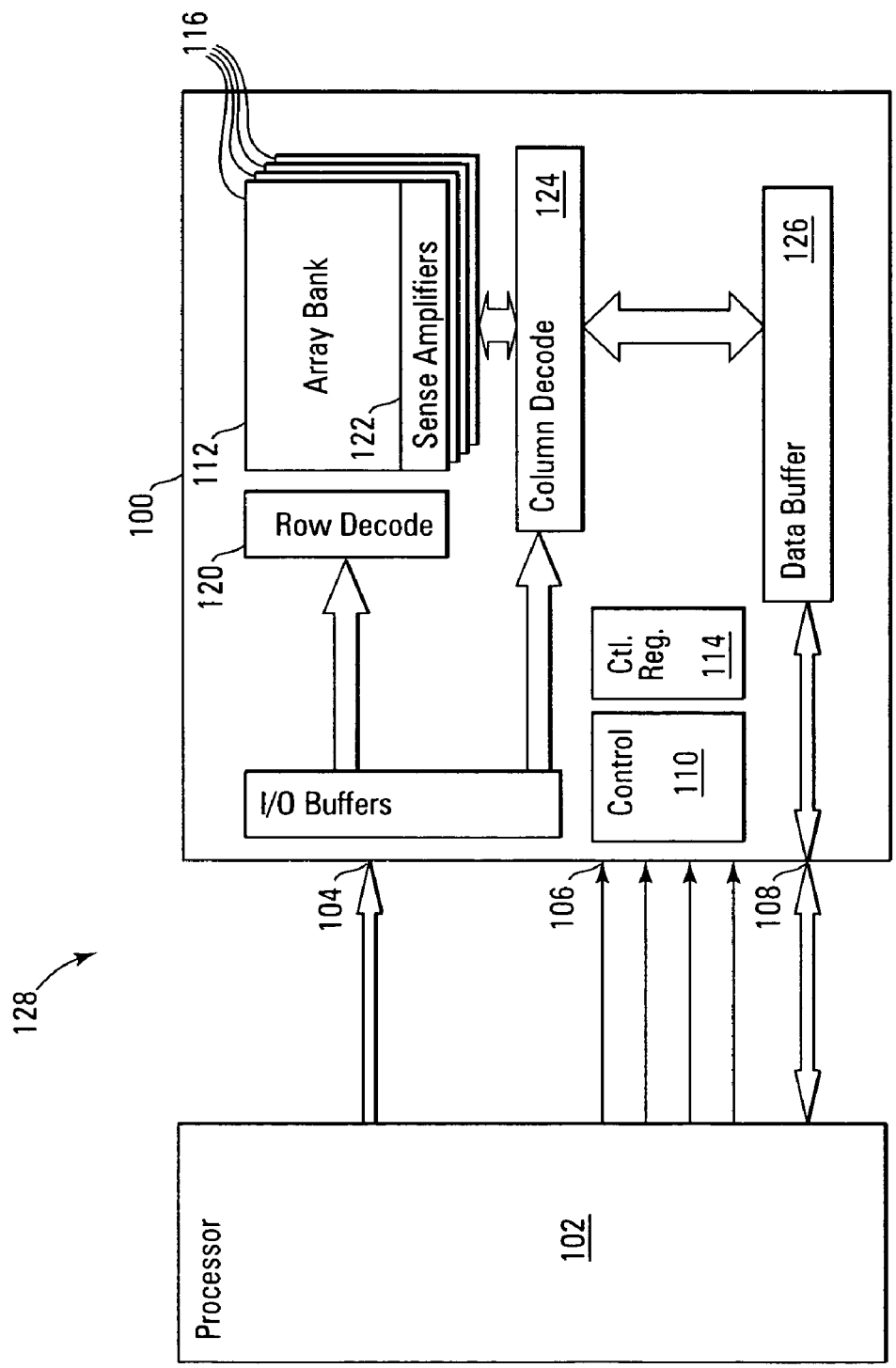
FIG. 1 is a simplified block diagram of a system containing a Flash memory device in accordance with an embodiment of the present invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

Embodiments of the present invention include non-volatile memory drivers, testing methods, and apparatuses that allow for deterministic testing and verification of non-volatile memories, non-volatile memory drivers, write operations/cycles, block erase operations/cycles, non-volatile memory management operations, and power loss recovery testing. In one embodiment, this accomplished by a counter in a low level driver that counts the number of program/erase operations or cycles. The memory device and software embodiments of the present invention utilize write or erase cycle tracking to interrupt or stop a non-volatile memory programming operation at a selected point. This ability to utilize write or erase cycle tracking to interrupt or stop a non-volatile memory programming operation at a selected point allows for halting or interrupting execution of the driver/software routine at each point that a non-volatile memory cell is programmed or erased in a selected operation. This allows for a deterministic and repeatable testing process of all stages of a write cycle or erase cycle where the state of non-volatile memory cells are changed in the non-volatile memory device. This also allows for step-through testing of each stage by programmer/designer of state changes of the non-volatile memory cells in the non-volatile memory device or driver software, enabling quick testing and easy logic and code changes, saving time and resources. Additionally, this ability to utilize write or erase cycle tracking to interrupt or stop a non-volatile memory programming operation at a selected point enables simulation of power loss at each point in a selected operation that a non-volatile memory cell is programmed or erased, allowing for improved, deterministic testing of the power loss recovery cycle and faster code/design change verification.

Because all the cells in an erase block of a Flash memory device must be erased at once, one cannot directly rewrite a Flash memory cell without first engaging in a block erase operation. Erase block management (EBM), typically a function of the driver, provides an abstraction layer for this to the host (a processor or an external memory controller), allowing the Flash device to appear as a freely rewriteable device, including, but not limited to, managing the logical address to physical erase block translation mapping for reads and writes, the assignment of erased and available erase blocks for utilization, and the scheduling erase blocks that have been used and closed out for block erasure. Data objects, which can be individual sectors, erase blocks, or logical file system entities, are created and managed through creation, updating, and invalidation/erasure by the EBM.

Erase block management also allows for load leveling of the internal floating gate memory cells to help prevent write fatigue failure. Write fatigue is where the floating gate memory cell, after repetitive writes and erasures, no longer properly erases and removes charge from the floating gate. Load leveling procedures increase the mean time between failure of the erase block and Flash memory device as a whole.

The complexity of the tasks of managing and interfacing to the Flash memory device(s) are such that the driver software/memory management software is typically segmented into a data manager layer (that is responsible for the higher level interfacing such as erase block management and address/logical device abstraction) and a low level device driver layer (that is responsible for the interfacing, command set sequences, and timing of interfacing to the specific memory device and provides basic read/program/erase functionality). These driver software/memory management software layers typically interface between each other by means of a defined "application interface" (API) that allows the differing layers to function without direct knowledge or control of the other layers.

Additionally, there is in some cases a further driver layer between the operating system/application, called the file manager. The file manager is responsible for managing filesystem data entities (typically separate data files or filesystem structures) and the logical structure/filesystem format of the memory device. The file manager (or in some cases, the data manager) can tailor its operation of the memory device to the device's storage usage by the operating system/application. The storage usage or access patterns of the memory device are called the "data model" of the memory use and can be used to optimize the memory's utilization by the application/system it is installed in. For example, a digital camera would require large data file storage that was frequently erased and reprogrammed, whereas a cell phone would typically require storage of many small data entities that would be frequently accessed but seldom changed.

After the overall driver's application interface (API) to the application/operating system acknowledges the write or erase operation request the successful execution of the data write/erasure is guaranteed. In executing these requests, a driver can operate in synchronous or asynchronous operating mode dependant on when it acknowledges the Flash operation request to the operating system/application. If the driver is still in the process of completing execution of the operation on the Flash memory device when it acknowledges the write or erase operation, the driver is known as an "asynchronous" driver and typically only occurs in systems capable of multi-tasking. This is opposed to "synchronous" driver operation where execution of the main operating system/application halts until the driver completes the entire operation.

The software routines and drivers that operate computer based devices are sometimes referred to as firmware or ROM after the non-volatile ROM machine-usable storage device that such routines have historically been stored in. It is noted that firmware or software routines can be stored on a variety of machine-usable storage mediums or firmware storage mediums that include, but are not limited to, a non-volatile Flash memory, a ROM, an EEPROM, a one time programmable (OTP) device, a complex programmable logic device (CPLD), an application specific integrated circuit (ASIC), a magnetic media disk, etc.

In many modern Flash memory devices implementations, the host interface and erase block management routines additionally allow the Flash memory device to appear as a read/write mass storage device (i.e., a magnetic disk) to the host. One such approach is to conform the interface to the Flash memory to be identical to a standard interface for a conventional magnetic hard disk drive allowing the Flash memory device to appear as a block read/write mass storage device or disk. This approach has been codified by the Personal Computer Memory Card International Association (PCMCIA), Compact Flash (CF), and Multimedia Card (MMC) standardization committees, which have each promulgated a standard for supporting Flash memory systems or Flash memory "cards" with a hard disk drive protocol. A Flash memory device or Flash memory card (including one or more Flash memory array chips) whose interface meets these standards can be plugged into a host system having a standard DOS (Disk Operating System) or compatible operating system with a Personal Computer Memory Card International Association—Advanced Technology Attachment (PCMCIA-ATA) or standard ATA interface. Other additional Flash memory based mass storage devices of differing low level formats and interfaces also exist, such as Universal Serial Bus (USB) Flash drives, Secure Digital Memory Card, or Sony MemoryStick.

Many of the modern computer operating systems, such as DOS, were developed to support the physical characteristics of hard drive structures; supporting file structures based on heads, cylinders and sectors. The DOS software stores and retrieves data based on these physical attributes. Magnetic hard disk drives operate by storing polarities on magnetic material. This material is able to be rewritten quickly and as often as desired. These characteristics have allowed DOS to develop a file structure that stores files at a given location which is updated by a rewrite of that location as information is changed. Essentially all locations in DOS are viewed as fixed and do not change over the life of the disk drive being used therewith, and are easily updated by rewrites of the smallest supported block of this structure. A sector (of a magnetic disk drive) is the smallest unit of storage that the DOS operating system supports. In particular, a sector has come to mean 512 bytes of information for DOS and most other operating systems in existence. Flash memory systems that emulate the storage characteristics of hard disk drives are preferably structured to support storage in 512 byte blocks along with additional storage for overhead associated with mass storage, such as ECC (error correction code) bits, status flags for the sector or erase block, and/or redundant bits.

FIG. 1 shows a simplified diagram of a system 128 incorporating a Flash memory device 100 and driver of the present invention coupled to a host 102, which is typically a processing device or memory controller. The Flash memory device 100 has an address interface 104, a control interface 106, and a data interface 108 that are each coupled to the processing device 102 to allow memory read and write accesses. Internal to the Flash memory device, a control state machine 110 directs the internal operation; managing the Flash memory array 112 and updating RAM control registers and non-volatile erase block management registers 114. The RAM control registers and tables 114 are utilized by the control state machine 110 during operation of the Flash memory device 100. The Flash memory array 112 contains a sequence of memory banks or segments 116. Each bank 116 is organized logically into a series of erase blocks (not shown). Memory access addresses are received on the address interface 104 of the Flash memory device 100 and divided into a row and column address portions. On a read access the row address is latched and decoded by row decode circuit 120, which selects and activates a row page (not shown) of memory cells across a selected memory bank. The bit values encoded in the output of the selected row of memory cells are coupled from a local bitline (not shown) to a global bitline (not shown) and detected by sense amplifiers 122 associated with the memory bank. The column address of the access is latched and decoded by the column decode circuit 124. The output of the column decode circuit 124 selects the desired column data from the internal data bus (not shown) that is coupled to the outputs of the individual read sense amplifiers 122 and couples them to the data buffer 126 for transfer from the memory device 100 through the data interface 108. On a write access the row decode circuit 120 selects the row page and column decode circuit 124 selects write sense amplifiers 122. Data values to be written are coupled from the data buffer 126 via the internal data bus to the write sense amplifiers 122 selected by the column decode circuit 124 and written to the selected floating gate memory cells (not shown) of the memory array 112. The written cells are then reselected by the row and column decode circuits 120, 124 and sense amplifiers 122 so that they can be read to verify that the correct values have been programmed into the selected memory cells.

FIG. 2 is a simplified diagram of another system 200 that incorporates a Flash memory subsystem 204 and associated Flash driver software routines of an embodiment of the present invention. In the system 200 of FIG. 2, the Flash memory subsystem 204, such as a memory system or Flash memory card, is coupled to a processor 202 with a synchronous interface having an address 206, control 208, and data bus 210. Internal to the Flash memory system 204, a memory controller 212 directs internal operation of the Flash memory system 204; managing the Flash memory devices 214, directing data accesses, updating internal control registers and tables (not shown), and/or directing operation of other possible subsystems (not shown) of the Flash memory system 204. The memory controller 212 is coupled to and controls one or more Flash memory devices 214 via an internal bus 236. Each Flash memory device 214 contains a sequence of erase blocks (not shown) in an internal memory array 216. It is noted that other architectures of Flash memory systems 204, external interfaces 206, 208, 210, and manners of coupling the memory controller 212 to the Flash memory devices 214, such as directly coupled individual control busses and signal lines, are possible and should be apparent to those skilled in the art with benefit of the present disclosure.

On power up of a system incorporating a Flash memory device or system, the driver typically executes the power loss recovery routine and scans the entire Flash memory, examining each data object by checking its status in an EBM data field. If the data object is marked in the EBM field as "complete" it is left alone. If the object is marked as "being updated", the object is checked and, if possible, the remaining steps to place the data object in a "complete" state are executed. If the data object is unable to be completed it is marked as "invalid." In the segmented driver described above, power loss recovery is generally the data manager's task to scan the Flash memory and correct or discard incomplete data objects, although in some cases the file manager, if present in the driver, may also be involved.

In embodiments of the present invention, the driver counts the number of write or erase operations for executing a selected Flash operation and then halts/interrupts execution at a selected write or erase operation. At this point the state of the processor and/or contents of the memory and registers can be inspected if desired. If the system is then brought back up again this tests the power loss recovery for the selected halt point in the Flash command and allows a known and definite testing coverage of the Flash memory device and driver for a particular case. This quantifies the power loss case for that particular software environment (and if desired, physical environment). In one embodiment, the counting of write or erase operations and/or halting/interrupting execution is done by a function incorporated into the low level driver. In one embodiment only write or only erase operations are counted. In another operation both write and erase operations are counted.

Write and erase commands are not executed in a rapid manner in typical Flash memory devices and can take up to several milliseconds to complete. This write/erase command time period is typically counted in the multiples of clock cycles for most hosts (i.e., processors or memory controllers). As such, in one embodiment of the present invention a driver executing on a host counts the number of write and/or erase operations for executing a selected Flash operation and at a selected write or erase operation counts (typically on a counter internal to the host) the number of clock cycles/time period into the execution of the write or erase command by the Flash memory device before halting/interrupting execution of the selected write or erase command. This allows the embodiment to simulate actual power loss at a given point in execution of a write/erase command and/or command sequence of a Flash memory device. This is particularly advantageous for testing Flash memory devices with multi-level cells, where each memory cell contains two or more memory data bits which are typically programmed in a single write operation. In another embodiment, as numerous Flash memory devices do not have a method of halting the execution of Flash commands that are executing internal to the device, this halting of execution is accomplished by the host triggering external hardware to remove power from the Flash memory device under test at a selected time or clock cycle count after issuing a Flash write or erase command.

In another embodiment of the present invention, the non-volatile memory device has a special purpose internal register that may be set to halt or stop the internal execution of a command in its command execution logic after a selected number of system clock cycles, or, in the case of a command execution logic state machine, a selected number of state machine steps. In one embodiment, the driver would load the special purpose internal register of the non-volatile memory device to halt execution of a command at a selected number of system clocks or command execution state machine steps and then loads and executes a command or command sequence to test. The non-volatile memory executes the command and halts/interrupts command execution at the selected number of system clocks or command execution state machine steps.

Figure 3A:
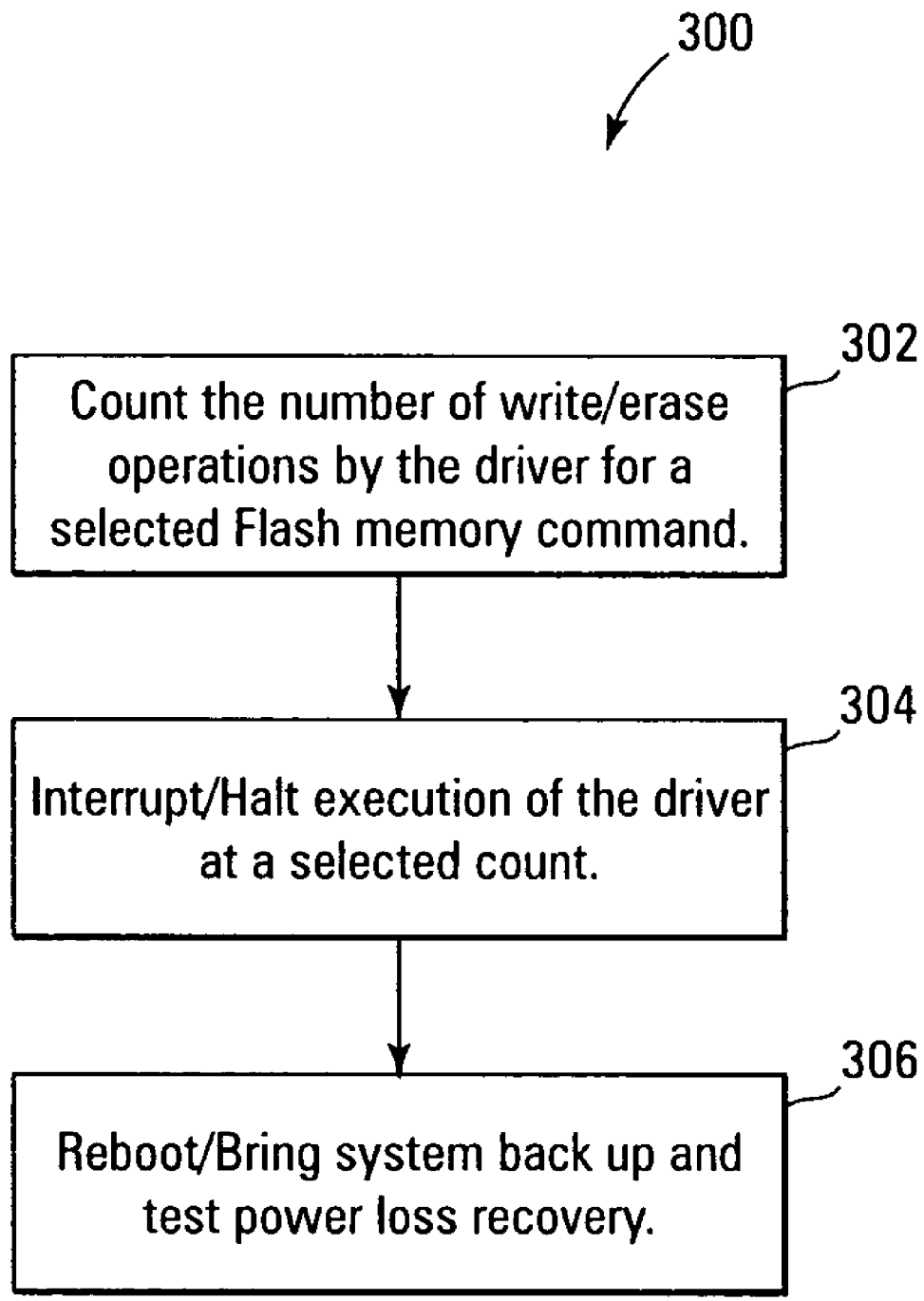
FIGS. 3A and 3B are simplified flowchart diagrams detailing operation of methods in accordance with embodiments of the present invention.

FIG. 3A shows a simplified flowchart 300 to a method of operating a Flash memory device driver of an embodiment of the present invention. In FIG. 3A, the memory device driver counts the number of erase and write operations 302 done to the Flash memory. At a selected count, the device driver then halts execution 304 of the current Flash memory command. At this point the state of the processor and/or content of the memory and registers of the system executing the device driver can optionally be inspected. The device driver then reboots/brings back up the system and the power loss recovery routine is tested 306 for the Flash memory command that was executed. If the halt is before the point where the Flash memory command can be completed by the power loss recovery routine, the data object should be placed/marked as invalid. If the sequence of writes and/or erases is halted after the Flash memory command can be completed, the power loss recovery routine should finish the execution of the command and mark the data object into a completed state.

With the addition of a step to automatically increment the write/erase count where the command is halted, the method of operating a device driver of FIG. 3A implements an iterative test of the executed Flash memory command. This allows a quantification of the power loss case for the selected Flash memory command. For example, incrementing through the above mentioned 43-step Flash operation to execute a make directory command allows the make directory command of the driver to be deterministically tested.

Figure 3B:
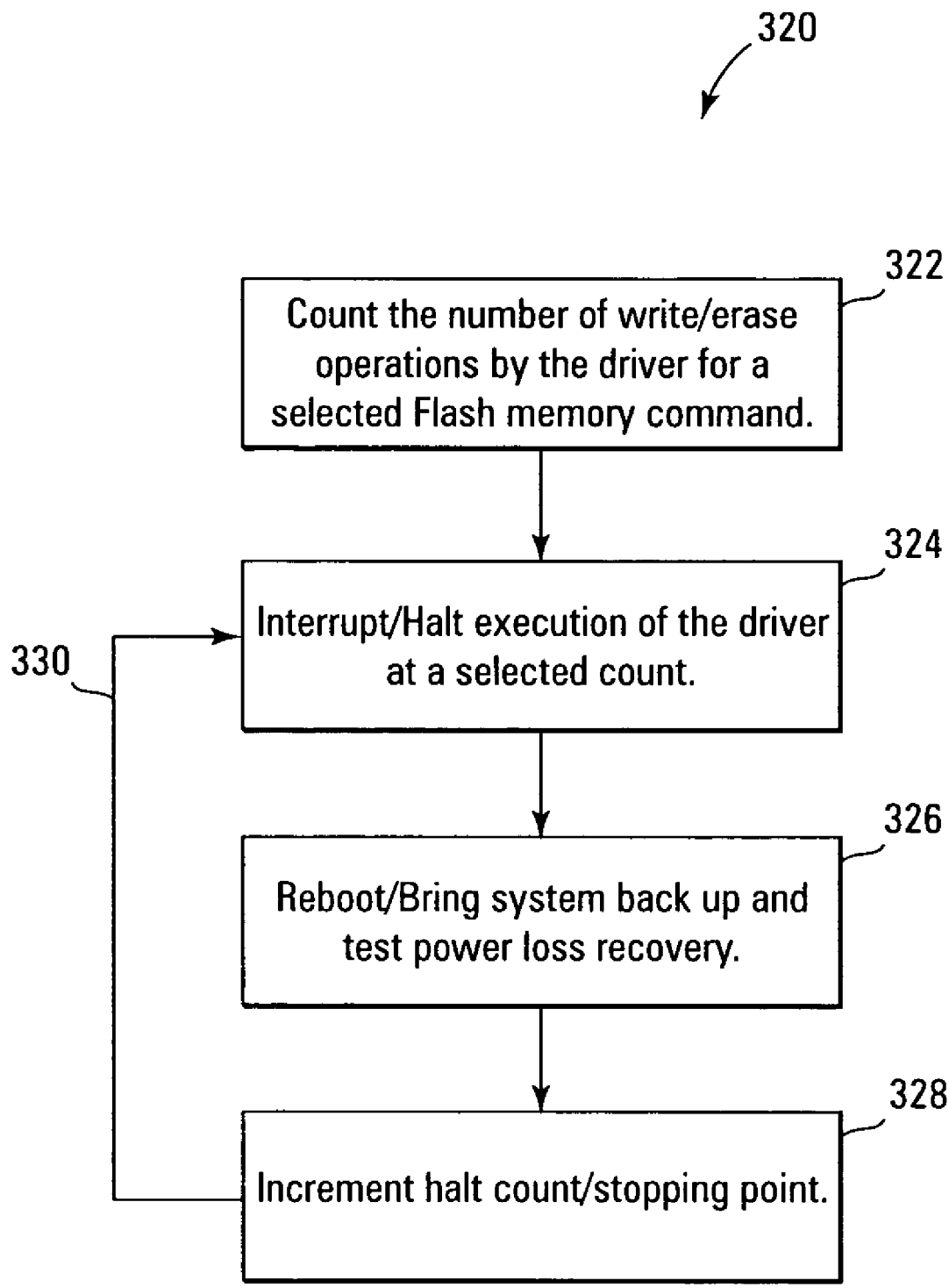

FIG. 3B shows a simplified flowchart 320 to a method of operating a Flash memory device driver of another embodiment of the present invention. In FIG. 3B, the memory device driver counts the number (N) of erase and write operations 322 done to the Flash memory. Starting from a selected halt count of one, the device driver then halts execution 324 of the current Flash memory command. The device driver then reboots/brings back up the system and the power loss recovery routine is tested 326 for the Flash memory command that was executed. After the power loss recovery is tested, the selected halt count is incremented 328 and the method loops 330 to repeat the Flash command halting now at the new incremented halt count. The method then repeats incrementing the halt count, halting on each repetition at a new halt count (i.e., 1, 2, 3, . . . , N), until power loss recovery has been tested by halting on each write/erase operation of the Flash memory command being tested. This allows a fast and definite testing coverage of the Flash memory device and driver for the selected Flash command, allowing a quantification of the power loss case for the selected command.

If the driver of FIG. 3B is utilized to step through and test each command of a Flash memory device command set, an iterative test of a whole command set is executed. This allows the user to test all known power loss cases of a Flash memory command set in a fast and deterministic manner. The testing of the write and erase operations of a selected Flash memory device and driver can be accomplished in a smaller period of time and with a high level of confidence in the power loss recovery cycle; helping to ensure that a latent error is not hiding in the power loss recovery cycle or routines. This deterministic driver testing also allows quick iterations of driver code development and verification of the code operation.

It is noted that other testing patterns and methodologies, such as starting with the final write/erase operation of the command and decrementing or verification of block management and erase commands before write commands, are possible for Flash memory command testing with embodiments of the present invention and will be apparent to those skilled in the art with the benefit of the present disclosure.

In another embodiment of the present invention, the write/erase counter of the driver allows for profiling of the number of write/erase operations a command utilizes in its execution by counting the number of write/erase operations it takes to complete. This profiling of a command can allow for automatic testing by allowing test run time determination of the number of write/erase operations of a command. Profiling can also allow the user to see what, if anything, has changed in the implementation of a command. This enables easy comparison of code versions, different command versions, or code from a separate source (i.e., a customer modified version of the code that was sent back to manufacturer for debugging and analysis).

In another embodiment of the present invention, the write/erase counter of the driver allows for code debugging by allowing the code to be stopped and the state of the processor and memory to be examined whenever information is recorded or erased in the Flash. This is particularly useful in debugging intermittent errors in the operation of the Flash memory. Differing inputs and environment stresses (such as voltage, temperature, noise, etc.) may be applied to the system or Flash memory and write or erase operations repeatedly run to locate problematic conditions or errors.

It is noted that driver testing with other embodiments of the present invention are possible and should be apparent to those skilled in the art with the benefit of the present disclosure.

CONCLUSION

A non-volatile memory device, driver, and method has been described that utilizes write or erase cycle tracking to interrupt or stop a non-volatile memory programming operation at a selected point to interrupt/stop execution or simulate power loss at a specific point. The various embodiments of the present invention relate to deterministic testing and verification of non-volatile memories, non-volatile memory drivers, write operations/cycles, block erase operations/cycles, non-volatile memory management operations, and power loss recovery testing. The memory device and software embodiments of the present invention utilize write or erase cycle tracking to interrupt or stop a non-volatile memory programming operation at a selected point. This ability to utilize write or erase cycle tracking to interrupt or stop a non-volatile memory programming operation at a selected point allows for halting or interrupting execution at each point in a selected operation that a non-volatile memory cell is programmed or erased. This allows for a deterministic and repeatable testing process of all stages of a write cycle or erase cycle where the state of non-volatile memory cells are changed in the non-volatile memory device. This also allows for step-through testing of each stage by programmer/designer of state changes non-volatile memory cells in the non-volatile memory device or driver software, enabling quick testing and easy logic and code changes, saving time and resources. Additionally, this ability to utilize write or erase cycle tracking to interrupt or stop a non-volatile memory programming operation at any selected point enables simulation of power loss at each point in a selected operation that a non-volatile memory cell is programmed or erased, allowing for improved, deterministic testing of the power loss recovery cycle and faster code/design change verification.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method of operating a non-volatile memory device driver comprising:
   counting a number of low level write and/or erase access cycles of a non-volatile memory command to a non-volatile memory without regard to a failure of the low level write and/or erase access cycle, wherein each low level write and/or erase access cycle modifies the state of at least one non-volatile memory cell of the non-volatile memory;
   halting access to the non-volatile memory at a selected count of low level write and/or erase access cycles;
   changing the selected count;
   re-executing the non-volatile memory command;
   counting the number of low level write and/or erase access cycles; and
   halting access to the non-volatile memory at the changed count of low level write and/or erase access cycles.

2. The method of claim 1, wherein the driver is a low level driver.

3. The method of claim 1, further comprising:
   examining the contents of the non-volatile memory and/or registers of the non-volatile memory after halting access to the non-volatile memory at the selected count of low level write and/or erase access cycles.

4. The method of claim 1, further comprising:
testing driver power loss recovery after halting access to the non-volatile memory at the selected count of low level write and/or erase access cycles.

5. The method of claim 1, wherein halting access to the non-volatile memory at a selected count of low level write and/or erase access cycles further comprises at a selected number of low write and/or erase access cycles, counting the number of clock cycles and halting execution of the low level write and/or erase access cycle at a selected number of clock cycles.

6. The method of claim 5, wherein halting execution of the access cycle at a selected number of clock cycles further comprises removing power from the non-volatile memory.

7. The method of claim 5, wherein halting execution of the low level write and/or erase access cycle at a selected number of clock cycles further comprises loading an internal register in the non-volatile memory and halting execution of a command execution logic of the non-volatile memory at the selected number of clock cycles.

8. The method of claim 5, wherein halting execution of the low level write and/or erase access cycle at a selected number of clock cycles further comprises loading an internal register in the non-volatile memory and halting execution of a command execution logic state machine of the non-volatile memory at a selected number of steps.

9. A method of operating a system comprising:
counting a number of low level write and/or erase access operations of a command to a Flash memory device coupled to a host without regard to a failure of the write and/or erase access operations, wherein each low level write and/or erase access operation modifies the state of at least one non-volatile memory cell of the Flash memory;
stopping access execution to the Flash memory at a selected number of access operations;
changing the selected number of access operations;
re-executing the command;
counting the number of low level write and/or erase access operations; and
stopping access execution to the Flash memory at the changed selected number of access operations.

10. The method of claim 9, further comprising:
examining a state of one or more host registers and/or the memory device after stopping execution.

11. The method of claim 9, further comprising:
rebooting the host after stopping access execution to the Flash memory.

12. The method of claim 9, further comprising:
executing power loss recovery routines on the Flash memory device.

13. The method of claim 9, wherein stopping access execution to the Flash memory at a selected number of low level write and/or erase access operations further comprises at a selected number of low level write and/or erase access operations, stopping execution of a current low level write or erase access operation at a selected time period.

14. The method of claim 13, wherein stopping execution of the current low level write or erase access operation at a selected time period further comprises removing power from the Flash memory device.

15. The method of claim 13, wherein stopping execution of the current low level write or erase access operation at a selected time period further comprises loading an internal register in the Flash memory device with a selected number of clock cycles and halting execution of a command execution logic of the Flash memory device at the selected number of clock cycles.

16. The method of claim 13, wherein stopping execution of the current low level write or erase access operation at a selected time period further comprises loading an internal register in the Flash memory device with a selected number of execution steps and halting execution of a command execution logic state machine of the Flash memory device at the selected number of steps.

17. A method of testing a Flash memory comprising:
counting a number of access operations to a Flash memory for a Flash command without regard to a failure of altering a state of any memory cell of the Flash memory altered by the access operations, wherein the access operations are low level write and/or erase access operations to the Flash memory to execute the Flash command and where each low level write and/or erase access operation modifies the state of at least one non-volatile memory cell of the Flash memory;
interrupting execution of the Flash command at a selected halt count of access operations, halting access to the Flash memory;
executing a power loss recovery cycle to test power loss recovery at the selected halt count;
changing the selected halt count;
re-executing the Flash command;
counting the number of access operations; and
interrupting execution of the Flash command at the changed halt count.

18. The method of claim 17, wherein counting the number of access operations further comprises counting a number of write and/or erase operations.

19. The method of claim 17, wherein changing the selected halt count further comprises decrementing the selected halt count.

20. The method of claim 17, wherein changing the selected halt count further comprises incrementing the selected halt count.

21. The method of claim 17, further comprising:
changing the Flash command to a second Flash command after all possible halt counts of the Flash command have been tested and testing the second Flash command.

22. The method of claim 17, wherein interrupting execution of the Flash command at a selected halt count of access operations, halting access to the Flash memory further comprises at a selected number of access operations, interrupting execution of the access operation at a selected number of clock cycles.

23. The method of claim 22, wherein interrupting execution of the access operation at a selected number of clock cycles, halting access to the Flash memory further comprises triggering external hardware to remove power from the Flash memory.

24. The method of claim 22, further comprising:
changing the selected number of clock cycles;
re-executing the Flash command;
counting a number of access operations to the selected access operation; and
interrupting execution of the Flash command at the changed selected number of clock cycles.

25. The method of claim 22, wherein changing the selected number of clock cycles further comprises incrementing the selected number of clock cycles.

26. The method of claim 22, wherein interrupting execution of the access operation at a selected number of clock cycles, halting access to the Flash memory further comprises loading an internal register in the Flash memory with the selected number of clock cycles and halting execution of a command execution logic of the Flash memory at the selected number of clock cycles.

27. The method of claim 22, wherein interrupting execution of the access operation at a selected number of clock cycles, halting access to the Flash memory further comprises loading an internal register in the Flash memory device with a selected number of execution steps and halting execution of a command execution logic state machine of the Flash memory device at the selected number of steps.

28. A method of profiling a Flash command comprising:
counting a number of low level access operations to a Flash memory during execution of a Flash command without regard to a success or failure of the access operations to create an access operation profile for the Flash command, wherein the low level access operations alter the state of at least one non-volatile memory cell of the Flash memory; and
comparing the access operation profile of two or more Flash commands.

29. The method of claim 28, wherein counting the number of low level access operations further comprises counting the number of low level write and/or erase operations.

30. A system comprising:
at least one Flash memory device; and
a host coupled to the at least one Flash memory device, wherein the host is adapted to:
count a number of low level write and/or erase access operations to the at least one Flash memory device during execution of a Flash command without regard to a success or failure of the write and/or erase access operations, wherein each low level write and/or erase access operation modifies the state of at least one non-volatile memory cell of the Flash memory,
halt execution of the Flash command, stopping access to the Flash memory device at a selected count of low level write and/or erase access operations,
execute a power loss recovery routine on the at least one Flash memory device,
change the selected count of low level write and/or erase access operations, and
re-execute the Flash command.

31. The system of claim 30, wherein the at least one Flash memory device is one of a NAND Flash and a NOR Flash.

32. The system of claim 30, wherein an interface to the Flash memory device is one of a PCMCIA-ATA, a Compact Flash (CF), a USB Flash, MemoryStick, Secure Digital Memory Card, and a multimedia card (MMC) compatible interface.

33. The system of claim 30, wherein the host is one of a processor and an external memory controller.

34. The system of claim 30, wherein the host is adapted to halt execution of the Flash command without regard to a success or failure of the write and/or erase access operations, stopping access to the Flash memory device at a selected count of low level write and/or erase access operations when a selected number of clock cycles has elapsed after issuing a last low level write or erase access operation that corresponds to the selected count of low level write and/or erase access operations.

35. The system of claim 34, wherein the system is adapted to halt execution of the last low level write and/or erase access operation at the selected number of cycles by removing power from the Flash memory.

36. A machine-usable medium, the machine-usable medium containing a software routine for causing a processor to execute a method, wherein the method comprises:
counting a number of low level write and/or erase access cycles to a Flash memory during execution of a Flash command without reading any non-volatile memory cells written or erased by the write and/or erase access cycles, wherein each low level write and/or erase access cycle modifies the state of at least one non-volatile memory cell of the Flash memory;
halting execution at a selected count of low level write and/or erase access cycles, halting access to the Flash memory;
changing the selected halt count of low level write and/or erase access cycles;
re-executing the Flash command;
counting a number of low level write and/or erase access cycles; and
halting execution at the changed count of low level write and/or erase access cycles.

37. The method of claim 36, wherein halting execution at a selected count, halting access to the Flash memory further comprises at a selected number of low level write and/or erase access cycles, counting the number of clock cycles and halting execution of a current low level write or erase access cycle at a selected number of clock cycles.

38. A system comprising:
at least one Flash memory device; and
a host coupled to the at least one Flash memory device, wherein the host comprises a means for counting a number of low level write and/or erase access cycles to the at least one Flash memory device during execution of a Flash command without regard to a success or failure of the write and/or erase access cycles and where each low level write and/or erase access cycle modifies the state of at least one non-volatile memory cell of the Flash memory device;
wherein the host comprises a means for halting execution of the Flash command on the at least one Flash memory device in response to the count of the access cycle counting means, stopping access to the Flash memory device at a selected halt count;
wherein the host comprises a means for changing the selected halt count of the access cycle counting means;
wherein the host comprises a means for re-executing the Flash command;
wherein the host comprises a means for counting the number of access operations with the access cycle counting means; and
wherein the host comprises a means for interrupting execution of the Flash command at the changed halt count.

39. The system of claim 38, wherein the host comprises a means for counting the number of low level write and/or erase access cycles to the at least one Flash memory device during execution of a Flash command and comprises a means for halting execution of the Flash command on the at least one Flash memory device in response to the count of the access cycle counting means, stopping access to the Flash memory device when a means for timing the execution of a last low level write or erase access cycle has elapsed.

* * * * *